US009112022B2

(12) United States Patent
Weber

(10) Patent No.: US 9,112,022 B2
(45) Date of Patent: Aug. 18, 2015

(54) SUPER JUNCTION STRUCTURE HAVING A THICKNESS OF FIRST AND SECOND SEMICONDUCTOR REGIONS WHICH GRADUALLY CHANGES FROM A TRANSISTOR AREA INTO A TERMINATION AREA

(71) Applicant: Infineon Technologies Austria AG, Villach (AT)

(72) Inventor: Hans Weber, Bayerisch Gmain (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 13/955,681

(22) Filed: Jul. 31, 2013

(65) Prior Publication Data

US 2015/0035048 A1 Feb. 5, 2015

(51) Int. Cl.
*H01L 29/66* (2006.01)
*H01L 21/02* (2006.01)
*H01L 21/336* (2006.01)
*H01L 29/78* (2006.01)
(Continued)

(52) U.S. Cl.
CPC ........ *H01L 29/7813* (2013.01); *H01L 29/1037* (2013.01); *H01L 29/402* (2013.01)

(58) Field of Classification Search
CPC ............ H01L 29/7813; H01L 29/7802; H01L 29/7827; H01L 29/66666; H01L 29/0696; H01L 29/66431; H01L 29/66462
USPC ......... 257/329, 655, 335, 200, 336, 618, 653, 257/E29.005; 438/268, 478, 510, 427
See application file for complete search history.

(56) References Cited

U.S. PATENT DOCUMENTS 3,772,577 A * 11/1973 Planey .......................... 257/496
6,291,856 B1 9/2001 Miyasaka et al.
6,551,909 B1 4/2003 Fujihira
(Continued)

FOREIGN PATENT DOCUMENTS

DE 19840032 C1 11/1999
DE 10132136 C1 2/2003
(Continued)

OTHER PUBLICATIONS

Lapadatu, D., et al., "A Model for the Etch Stop Location on Reverse Biased pn Junctions" International Conference on Solid State Sensors and Actuators, Jun. 16-19, 1997, pp. 259-267, vol. 1, Chicago.

*Primary Examiner* — Long K Tran
*Assistant Examiner* — Dzung Tran
(74) *Attorney, Agent, or Firm* — Murphy, Bilak & Homiller, PLLC

(57) ABSTRACT

A super junction semiconductor device includes a super junction structure including first and second areas alternately arranged along a first lateral direction and extending in parallel along a second lateral direction. Each one of the first areas includes a first semiconductor region of a first conductivity type. Each one of the second areas includes, along the first lateral direction, an inner area between opposite second semiconductor regions of a second conductivity type opposite to the first conductivity type. A width $w_1$ of the first of the first semiconductor region in a transistor cell area is greater than in an edge termination area, and a width $w_2$ of each one of the second semiconductor regions in the transistor cell area is greater than in the edge termination area.

8 Claims, 11 Drawing Sheets

(51) Int. Cl.
*H01L 29/10* (2006.01)
*H01L 29/40* (2006.01)

(56) References Cited

U.S. PATENT DOCUMENTS

| | | |
|---|---|---|
| 6,633,064 B2 | 10/2003 | Auerbach et al. |
| 6,750,104 B2 | 6/2004 | Blanchard et al. |
| 6,819,089 B2 | 11/2004 | Deboy et al. |
| 8,421,196 B2 | 4/2013 | Weber et al. |
| 2002/0070418 A1 | 6/2002 | Kinzer et al. |
| 2004/0012038 A1 | 1/2004 | Kouzuki et al. |
| 2005/0181577 A1* | 8/2005 | Hshieh ............... 438/427 |
| 2005/0184336 A1* | 8/2005 | Takahashi et al. ........ 257/328 |
| 2006/0214221 A1* | 9/2006 | Challa et al. ........... 257/328 |
| 2007/0222019 A1 | 9/2007 | Rochefort et al. |
| 2009/0079002 A1* | 3/2009 | Lee et al. ............. 257/355 |
| 2010/0187599 A1* | 7/2010 | Sasaki ................ 257/329 |

FOREIGN PATENT DOCUMENTS

| | | |
|---|---|---|
| DE | 10234996 B4 | 1/2008 |
| DE | 102010060782 A1 | 6/2011 |

* cited by examiner

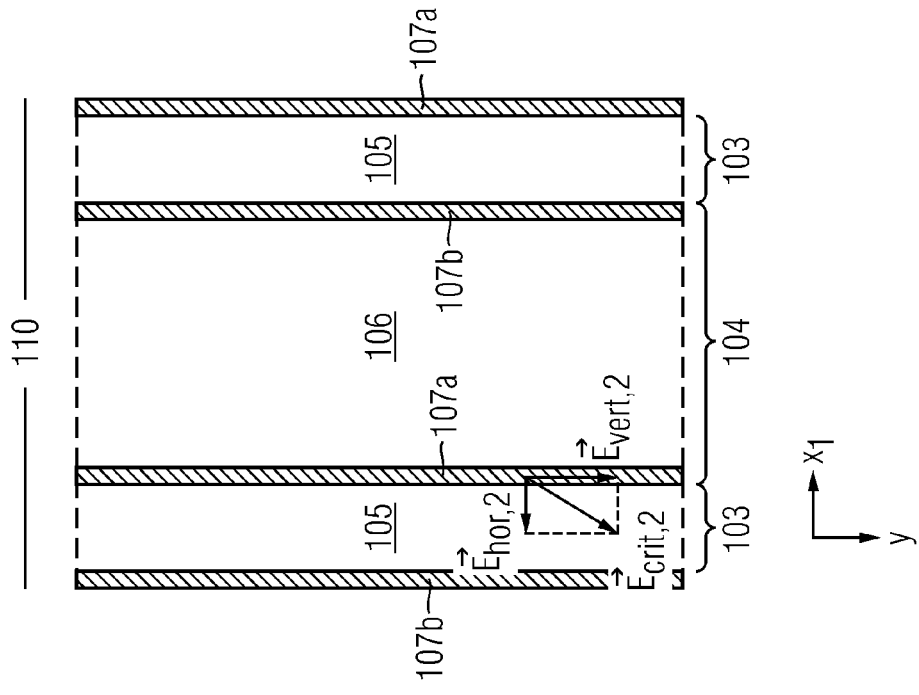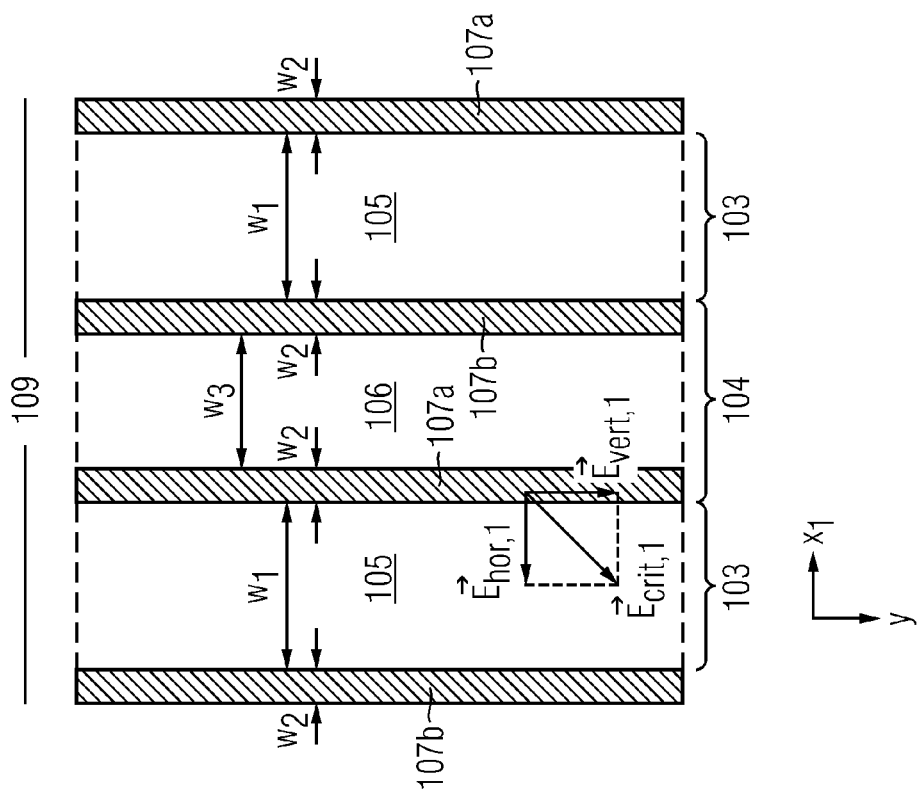

US 9,112,022 B2

SUPER JUNCTION STRUCTURE HAVING A THICKNESS OF FIRST AND SECOND SEMICONDUCTOR REGIONS WHICH GRADUALLY CHANGES FROM A TRANSISTOR AREA INTO A TERMINATION AREA

BACKGROUND

Semiconductor devices such as super junction (SJ) semiconductor devices, e.g. SJ insulated gate field effect transistors (SJ IGFETs) are based on mutual space charge compensation of n- and p-doped regions in a semiconductor body allowing for an improved trade-off between low area-specific on-state resistance $R_{on} \times A$ and high breakdown voltage $V_{br}$ between load terminals such as source and drain. Edge terminations aim at shifting electrical breakdown from an edge termination area into a transistor cell area for avoiding degradation of blocking voltage due to undesirable electrical breakdown in the edge termination.

It is desirable to improve the trade-off between the area-specific on-state resistance and the blocking voltage of a semiconductor device.

SUMMARY

According to an embodiment, a super junction semiconductor device includes a super junction structure including first and second areas alternately arranged along a first lateral direction and extending in parallel along a second lateral direction. Each one of the first areas includes a first semiconductor region of a first conductivity type. Each one of the second areas includes, along the first lateral direction, an inner area between opposite second semiconductor regions of a second conductivity type opposite to the first conductivity type. A width $w_1$ of the first semiconductor region in a transistor cell area is greater than in an edge termination area. A width $w_2$ of each one of the second semiconductor regions in the transistor cell area is greater than in the edge termination area.

According to another embodiment, a super junction device includes a super junction structure including first and second areas alternately arranged along a first lateral direction and extending in parallel along a second lateral direction. Each one of the first areas includes a first semiconductor region of a first conductivity type. Each one of the second areas includes, along the first lateral direction, an inner area between opposite second semiconductor regions of a second conductivity type opposite to the first conductivity type. The semiconductor device further includes a channel stopper structure including a doped semiconductor region electrically coupled to a field plate. The second semiconductor regions extending along the second lateral direction from a cell area through an edge termination area overlaps with the field plate.

According to yet another embodiment, a semiconductor device includes a super junction structure including first and second areas alternately arranged along a first lateral direction and extending in parallel along a second lateral direction. Each one of the first areas includes a first semiconductor region of a first conductivity type. Each one of the second areas includes, along the first lateral direction, an inner area between opposite second semiconductor regions of a second conductivity type opposite the first conductivity type. The semiconductor device further includes a transition area between a cell area and an edge termination area. A depth $d_2$ of the second semiconductor regions in different once of the second areas decreases, along the first lateral direction, from the cell area to the transition area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3A is a schematic cross-sectional view along line A-A' in the cell area of the semiconductor device illustrated in FIG. 1.

FIG. 3B is a schematic cross-sectional view along line B-B' in the edge termination area of the semiconductor device illustrated in FIG. 1.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise. The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
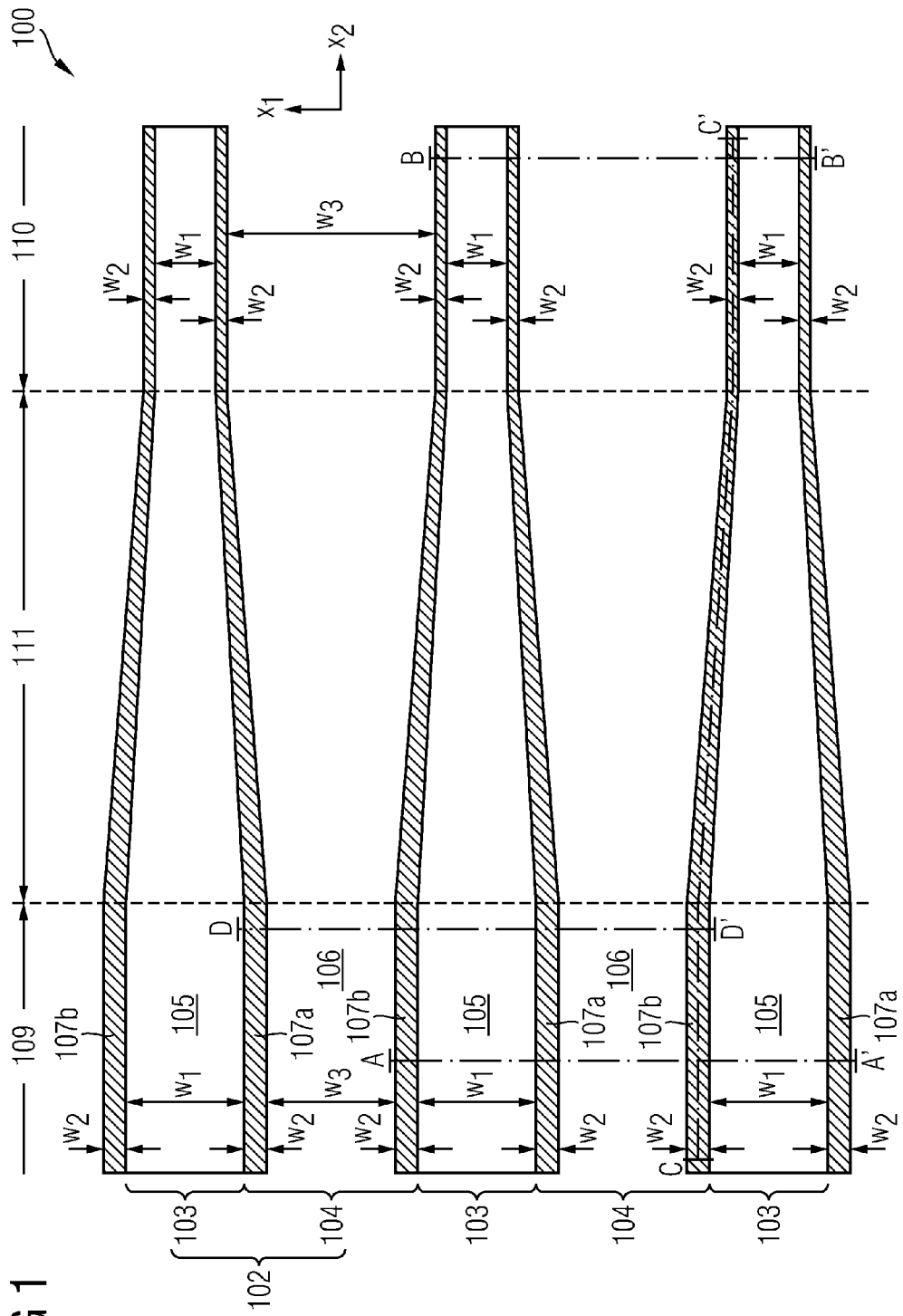
FIG. 1 is top view of a sectional plane that is parallel to and located between first and second sides of a semiconductor body according to an embodiment of a semiconductor device.

FIG. 1 illustrates a top view of a sectional plane parallel to and located between first and second sides of a semiconductor body 100 according to an embodiment of a semiconductor device. The semiconductor body is provided from a single-crystalline semiconductor material, for example silicon (Si), silicon carbide (SiC), germanium (Ge), silicon germanium (SiGe), gallium nitride (GaN) or gallium arsenide (GeAs). A distance between the first and second sides, i.e. a thickness of the semiconductor body may range between 20 µm and 300 µm, for example. A normal to the first and second sides defines a vertical direction and directions orthogonal to the normal direction are lateral directions.

A super junction structure 102 of the semiconductor device includes first and second areas 103, 104 alternately arranged along a first lateral direction $x_1$ and extending in parallel along a second lateral direction $x_2$. Each one of the first areas 103 includes a first semiconductor region 105 of a first conductivity type, e.g. an n-type mesa region. Each one of the second areas 104 includes, along the first lateral direction $x_1$, an inner area 106 between opposite second semiconductor regions 107a, 107b of a second conductivity type, e.g. a p-type opposite to the an n-type being the first conductivity type in this example. A width $w_1$ of the first semiconductor region 105 in a transistor cell area 109 is greater than in an edge termination area 110. A transition area 111 is located between the transistor cell area 109 and the edge termination area 110. In the transistor cell area 109, transistor cells are arranged including contacts to load/control terminal(s), e.g. contact plugs or contact lines electrically connected to semiconductor regions in the semiconductor body such as $n^+$-doped source regions, for example. The edge termination area 110 aims at shifting electrical breakdown into the transistor cell area 109 for avoiding degradation of blocking voltage due to undesirable electrical breakdown in the edge termination that may be caused by curvature of equipotential lines in this area.

According to an embodiment the width $w_1$ of the first semiconductor region 105 in the edge termination area 110 ranges between 30% to 90% or between 40% to 80% of the width $w_1$ of the semiconductor region 105 in the transistor cell area 109.

A width $w_3$ of the inner area 106 in the transistor cell area 109 is smaller than in the edge termination area 110. According to the embodiment illustrated in FIG. 1, the widths $w_1$, $w_2$, $w_3$ continuously change, i.e. decrease in the transition area 111, along the second lateral direction $x_2$, from a first value in the transistor cell area 109 to a second value in the edge termination area 110.

According to an embodiment, a doping concentration in each one of the second semiconductor regions 107a, 107b is greater than in each one of the first semiconductor regions 105. For a semiconductor body made of silicon a doping concentration in the first semiconductor regions 105 may range between $1 \times 10^{15}$ cm$^{-3}$ and $1.5 \times 10^{16}$ cm$^{-3}$, whereas a doping concentration in each one of the second semiconductor regions 107a, 107b may range between $5 \times 10^{15}$ cm$^{-3}$ and $1 \times 10^{17}$ cm$^{-3}$. N-type dopants like phosphorous (P), arsenic (As) or antimony (Sb) may define an n-type in each one of the first semiconductor regions 105. P-type dopants like boron (B), aluminum (Al), indium (In) or gallium (Ga) may define a p-type in each one of the second semiconductor regions 107a, 107b. The width $w_1$ of the first semiconductor region 105 in the transistor cell area 109 may range between 500 nm and 5 µm, for example. The width $w_2$ of the second semiconductor regions 107a, 107b may range between 100 nm and 3 µm, for example.

According to an embodiment, the inner area 106 includes undoped, i.e. intrinsic or lightly doped semiconductor material(s). A doping concentration of the semiconductor material(s) of the inner area 106 is smaller than in the first semiconductor region 105. Void(s) with or without gas inclusion may be located in the inner area 106. According to an embodiment, the void(s) are caused by processing the semiconductor body

100. According to another embodiment, the inner area 106 is made of or includes dielectric material(s), e.g. an oxide like $SiO_2$ and optional void(s) with our without gas insertion. According to another embodiment, the inner area may include a combination of undoped or lightly doped semiconductor material(s) and dielectric material(s) with optional void(s) with our without gas insertion.

According to an embodiment, the semiconductor device is a super junction transistor. The semiconductor device may be a super junction insulated gate field effect transistor (SJ IGFET), e.g. a SJ metal oxide semiconductor field effect transistor (SJ MOM-ET), or a super junction insulated gate bipolar transistor (SJ IGBT). According to an embodiment, a blocking voltage of the semiconductor device ranges between 100 V and 5000 V, and may further be in a range between 200 V and 1000 V. The SJ transistor may be a vertical SJ transistor including one load terminal, e.g. a source terminal at a front side of the semiconductor body 100, and another load terminal, e.g. a drain terminal at the rear side of the semiconductor body 100.

Figure 2:
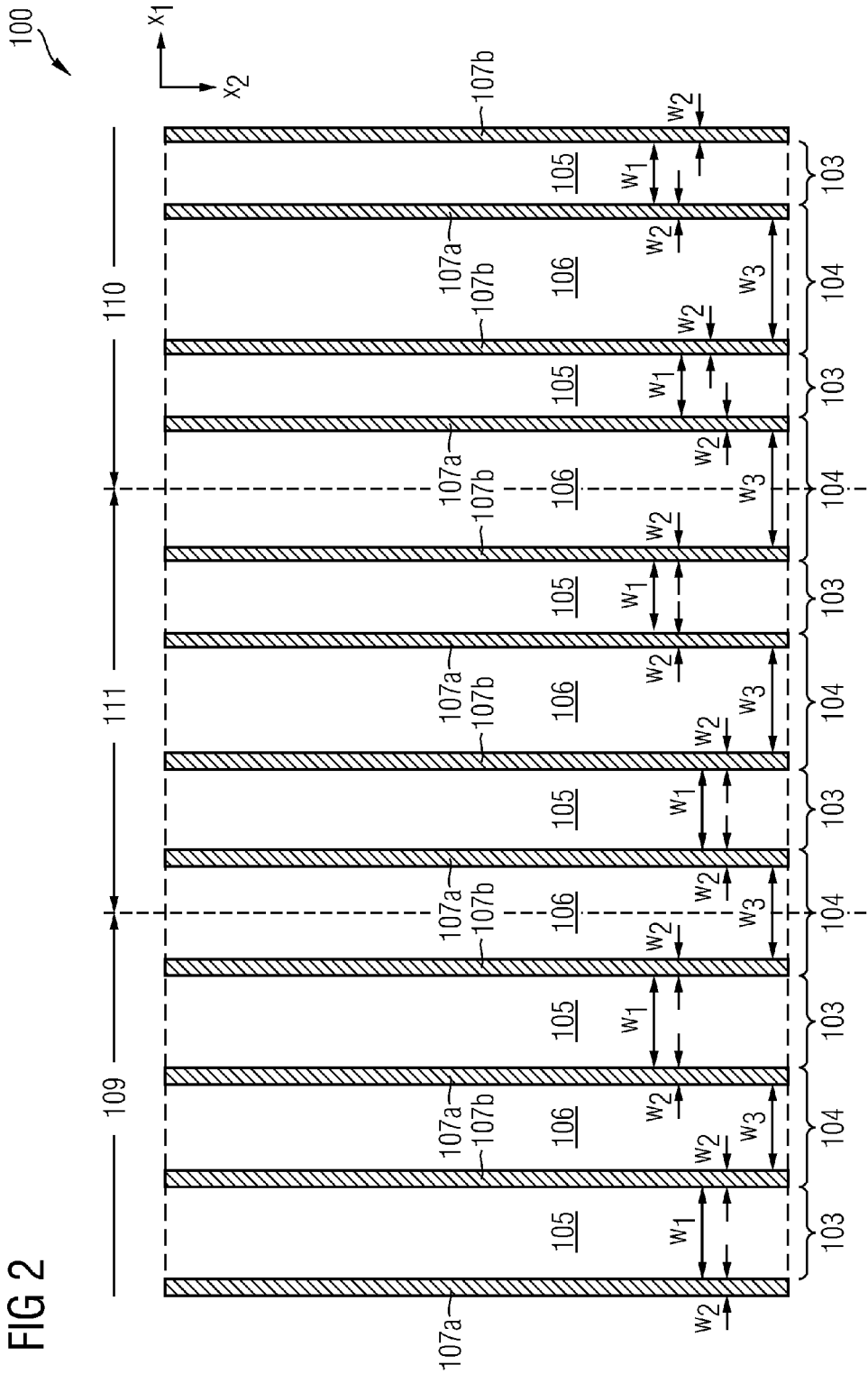
FIG. 2 is a top view of a sectional plane that is parallel to and located between first and second sides of a semiconductor body according to another embodiment of a semiconductor device.

FIG. 2 is a top view of a sectional plane parallel to and located between first and second sides of the semiconductor body 100 according to another embodiment of a semiconductor device. In the top view of FIG. 1, a shape of the first and second areas 103, 104 is illustrated along the second lateral direction $x_2$ between the transistor cell area 109 and the edge termination area 110. In the schematic top view of FIG. 2, the shape of the first and second areas 103, 104 is illustrated along the first lateral direction $x_1$ between the transistor cell area 109 and the edge termination area 110.

In the embodiment illustrated in FIG. 2, the widths $w_1$, $w_2$, $w_3$ in different ones of the alternately arranged first and second areas 103, 104 gradually change, along the first lateral direction $x_1$ from a first value in the transistor cell area 109 to a second value in the edge termination area 110, respectively. In the embodiment illustrated in FIG. 2 having two first semiconductor regions 105 in the transition area 111, exemplary values of the width $w_1$ may correspond to 100% of a reference value in the transistor cell area 109, to 90% of the reference value in the first semiconductor region 105 located in the transition area 111 adjoining the transistor cell area 109, to 80% of the reference value in the first semiconductor region 105 located in the transition area 111 adjoining the edge termination area 110, and to 70% of the reference value in the edge termination area 110. These values may differ in other embodiments, and may be dependent upon a number of first semiconductor regions 105 in the transition area. The exemplary values with respect to dimensions, doping concentrations, materials and the like given with respect to the description of FIG. 1 apply likewise to FIG. 2.

The specific change of widths $w_1$, $w_2$, $w_3$ between the transistor cell area 109 and the edge termination area 110 allows for an improved super junction structure as will be described with respect to the schematic cross-sectional views of FIGS. 3A and 3B.

FIG. 3A is a schematic cross-sectional view along line A-A' in the cell area 109 of the semiconductor device illustrated in FIG. 1.

In the transistor cell area 109 an electric field vector $E_{crit,1}$ at a breakdown voltage $V_{br}$ includes a lateral electric field component $E_{hor,1}$ and a vertical electric field component $E_{vert,1}$.

FIG. 3B is a schematic cross-sectional view along line B-B' in the edge termination area 110 of the semiconductor device illustrated in FIG. 1. The widths $w_1$, $w_2$ of the first and second semiconductor regions 105, 107a, 107b in the edge termination area 110 are smaller than in the transistor cell area 109 as is illustrated in FIG. 1. Hence, a charge capacity per unit length of the first and second semiconductor regions 105, 107a, 107b in the edge termination area 110 is smaller than in the transistor cell area 109 caused by a smaller space charge of the second semiconductor regions 107a, 107b per unit length in the edge termination area 110. An amount of a lateral electric field component $E_{hor,2}$ in the edge termination area 110 is smaller than the amount of the lateral electric field component $E_{hor,1}$ in the transistor cell area 109. Hence, the amount of the vertical electric field component $E_{vert,2}$ in the edge termination area 110 can exceed the amount of the vertical electric field component $E_{vert,1}$ in the transistor cell area 109. Since the vertical electric field component represents a blocking voltage capability, a specific design of widths $w_1$, $w_2$ of the first and second semiconductor regions 105, 107a, 107b illustrated in the embodiments of FIGS. 1 and 2 allows for an increase of the voltage blocking capability in the edge termination area 110 compared with the transistor cell area 109. Thereby, ruggedness and reliability of the semiconductor device can be improved. The specific design of widths $w_1$, $w_2$ of the first and second semiconductor regions 105, 107a, 107b can be achieved by electrochemical etching of the second semiconductor regions 107a, 107b in trenches represented by the second areas 104 illustrated in FIGS. 1 and 2, for example.

Figure 4:
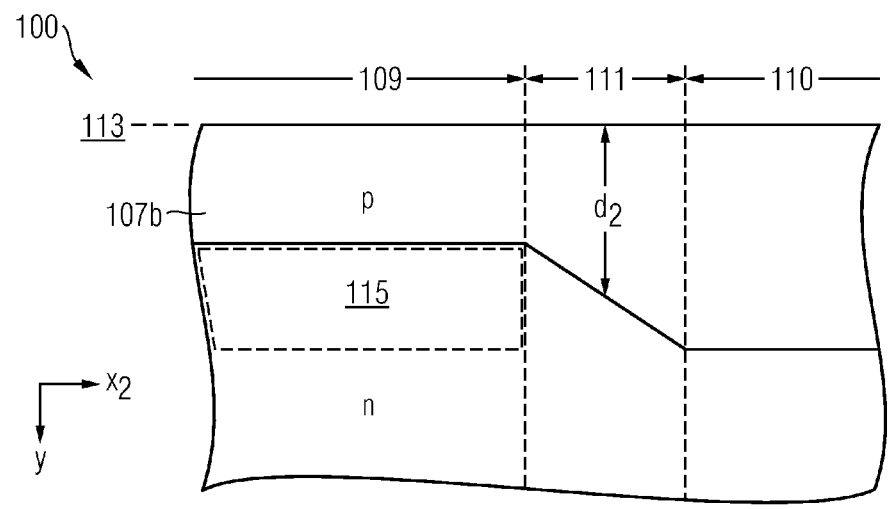
FIG. 4 is a cross-sectional view illustrating one embodiment of a transition area between the transistor cell area having a depth $d_2$ of a p-doped compensation region decreasing from the transistor cell area into the transition area.

FIG. 4 is a cross-sectional view illustrating one embodiment of the transition area 111 between the transistor cell area 109 and the edge termination area 110. The exemplary cross-sectional view is taken along line C-C' of the semiconductor device illustrated in FIG. 1. In the illustrated embodiment, the second semiconductor region 107b is p-doped having a depth $d_2$ along the vertical direction y extending perpendicular to a first side 113. An n-doped part of the semiconductor body 100 adjoins a bottom side of the second semiconductor region 107b. The depth $d_2$ of the second semiconductor region 107b decreases from a first value in the transistor cell area 109 through the transition area 111 to a second value in the edge termination area 110. Whereas portion 115 of the semiconductor body 100 is entirely arranged below the second semiconductor region 107b in the transistor cell area 109, a corresponding portion of the semiconductor body 100 in the edge termination area 110 is alternately arranged with second semiconductor regions 107a, 107b along a direction perpendicular to a drawing plane of FIG. 4. This leads to an increase of a voltage blocking capability in the edge termination area 110 compared with the transistor cell area 109 for similar reasons as described above with reference to FIGS. 3A and 3B. Again, device ruggedness and device reliability can be improved. The above-described effect is particularly effective in edge regions having mainly a vertical component, i.e. in edge regions directly adjoining the transistor cell area 109.

Trench endings are singularities and constitute a break of a continuous cell design. As an example, epitaxial filling behavior and epitaxial growth behavior at trench endings are different from the transistor cell array. Thus, also a charge compensation in a super junction structure including trenches behaves different at trench endings compared with an inner part of the trench within the transistor cell array.

Figure 5A:
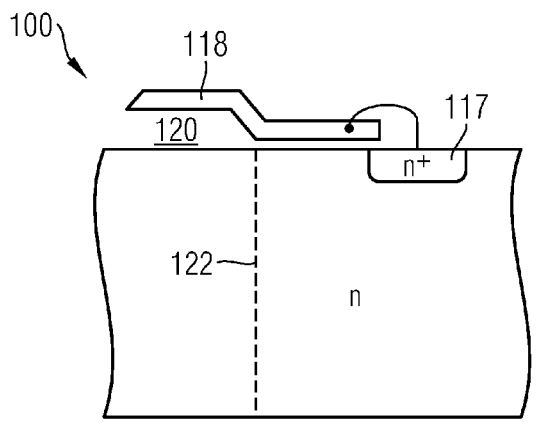
FIG. 5A is a cross-sectional view of one embodiment of a semiconductor device with a channel stopper structure including a doped semiconductor region electrically coupled to a field plate.

FIG. 5A is a cross-sectional view of one embodiment of a semiconductor device with a channel stopper structure including an $n^+$-doped semiconductor region 117 electrically coupled to a field plate 118, e.g. a polysilicon and/or metal field plate. A dielectric 120, e.g. an oxide such as $SiO_2$ and/or a nitride such as $Si_3N_4$ is arranged between the field plate 118 and the semiconductor body 100. Transition line 122 denotes a location where a thickness of the dielectric 120 increases towards a transistor cell area or a location where the field plate bends.

Figure 5B:
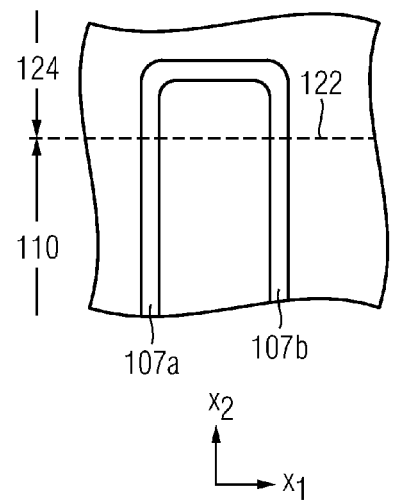
FIG. 5B is top view of the semiconductor device illustrated in FIG. 5A.

FIG. 5B is a top view of the semiconductor device illustrated in FIG. 5A. The second semiconductor regions 107a, 107b extend along the second lateral direction $x_2$ through the edge termination area 110 into a field-free area 124. Thus, when forming the second semiconductor regions 107a, 107b in trenches, e.g. by electrochemical etching, trench endings are placed in the field-free area 124 beyond the channel stopper structure. Thereby, trench endings are transferred into an area where their impact on charge compensation does not cause harm to device ruggedness and device reliability.

Figure 6:
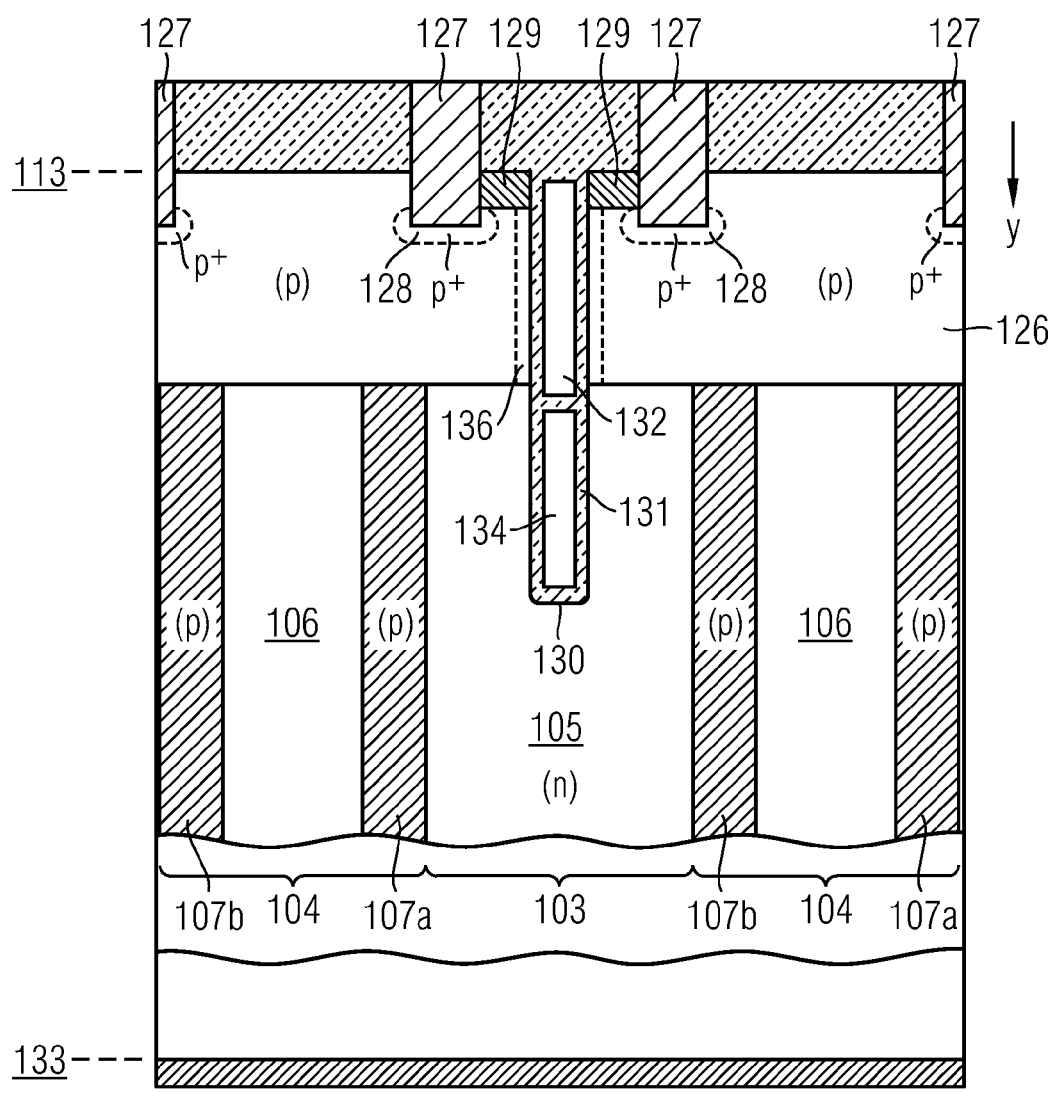
FIG. 6 illustrates one embodiment of a schematic cross-sectional view along line A-A' in the cell area of the semiconductor device illustrated in FIG. 1.

FIG. 6 illustrates one embodiment of a schematic cross-sectional view along line D-D' in the transistor cell area 109 of the semiconductor device illustrated in FIG. 1. Above the super junction structure including the first and second areas 103, 104, a p-doped body region 126 adjoins. The p-doped body region 126 is electrically coupled to source contacts 127 via a $p^+$-doped body contact zone 128. Sidewalls of the source contacts 127 are also electrically coupled to $n^+$-doped source regions 129. Other contact schemes for electrically coupling the body and source regions 126, 129 to the source contacts 127 may likewise apply. Between opposite source regions 129 a trench 130 extends into the first semiconductor regions 105 along the vertical direction y. A dielectric structure 131 electrically isolates a gate electrode 132 in an upper part of the trench 130 from a surrounding part of the p-doped body region 126 and furthermore electrically isolates a field electrode 134 in a lower part of the trench 130 from a surrounding part of the first semiconductor region 105. By applying a voltage to the gate electrode 132 a conductivity along a channel region 136 can be controlled by field-effect.

The semiconductor device illustrated in FIG. 6 is a vertical IGFET including a first load terminal, e.g. a source terminal including the source contacts 127 at the first side 113 of the semiconductor body 100 and a second load terminal, e.g. a drain terminal including a drain contact 139 at a second side 133 of the semiconductor body 100 opposite to the first side 113. Exemplary top views of the semiconductor device of FIG. 6 are illustrated in FIGS. 1, 2, and 5B.

Figure 7:
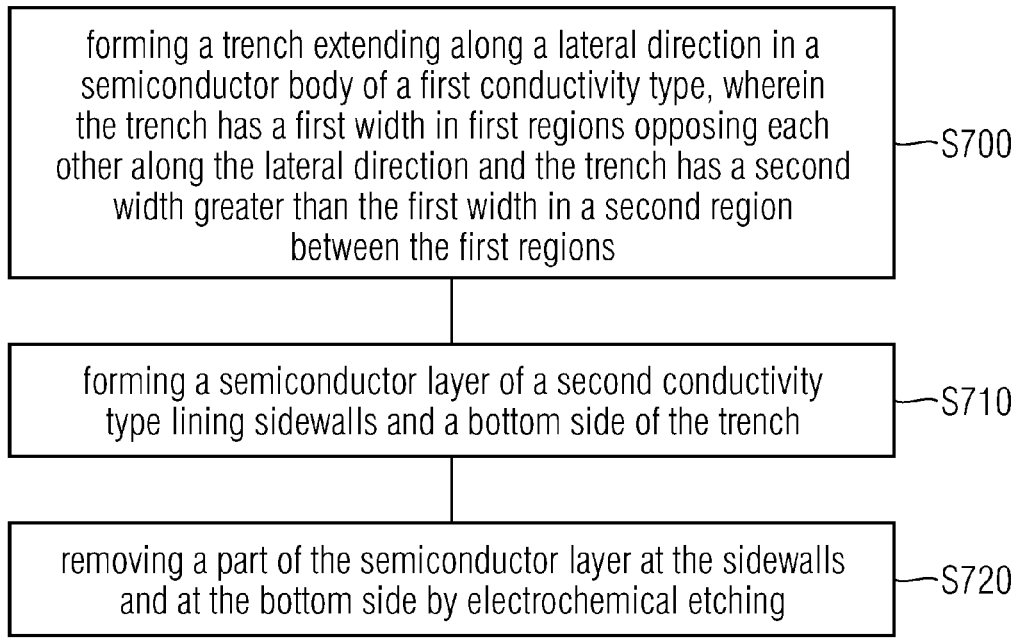
FIG. 7 is a schematic illustration of a process flow of a method of manufacturing a semiconductor device including electrochemical etching of a part of a semiconductor layer in a trench having a first width in first regions opposing each other a second width greater than the first width in a second region between the first regions.

FIG. 7 is a schematic illustration of a process flow of a method of manufacturing a super junction semiconductor device.

Process feature S700 includes forming a trench extending along a lateral direction in semiconductor body of a first conductivity type, wherein the trench has a first width in first regions opposing each other along the lateral direction and the trench has a second width greater than the first width in a second region between the first regions.

Process feature S710 includes forming a semiconductor layer of a second conductivity type lining sidewalls and a bottom side of the trench.

Process feature S720 includes removing a part of the semiconductor layer at the sidewalls and at the bottom side by electrochemical etching.

The trench may be filled with one or with a combination of intrinsic semiconductor material, lightly doped semiconductor material, dielectric material and a void.

Figure 8:
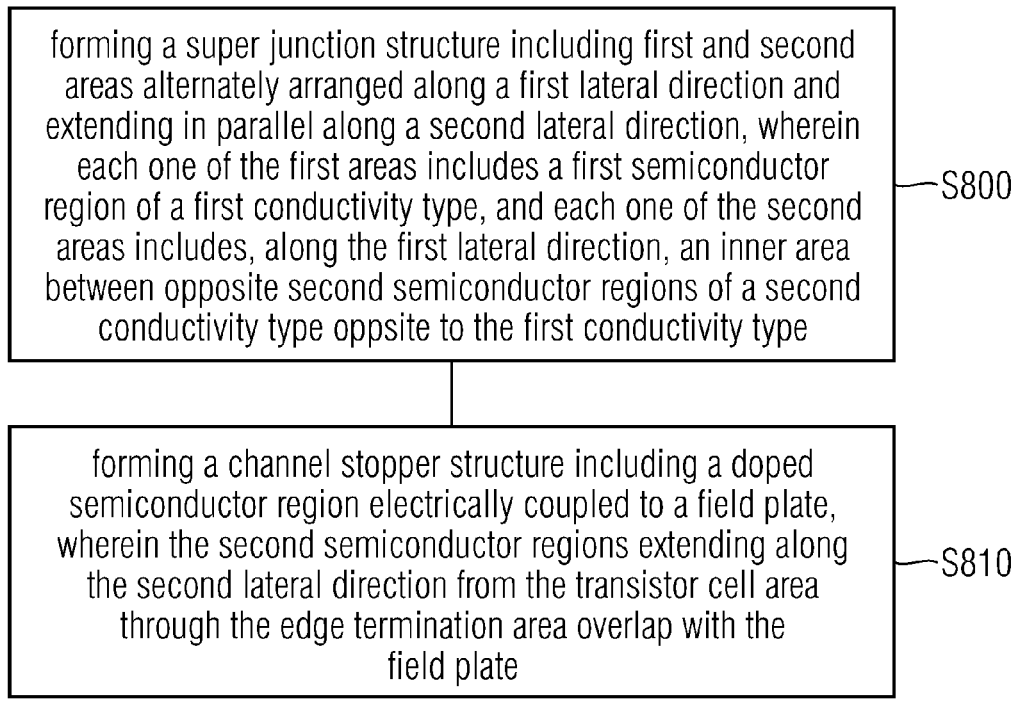
FIG. 8 is a schematic illustration of a process flow of manufacturing a super junction structure including a channel stopper structure.

FIG. 8 is a schematic illustration of a process flow of another method of manufacturing a super junction semiconductor device.

Process feature S800 includes forming a super junction structure including first and second areas alternately arranged along a first lateral direction and extending in parallel along a second lateral direction, wherein each one of the first areas includes a first semiconductor region of a first conductivity type, and each one of the second areas includes, along the first lateral direction, an inner area between opposite second semiconductor regions of a second conductivity type opposite to the first conductivity type.

Process feature S810 includes forming a channel stopper structure including a doped semiconductor region electrically coupled to a field plate, wherein the second semiconductor regions extending along the second lateral direction from the transistor cell area through the edge termination area overlap with the field plate.

Figure 9:
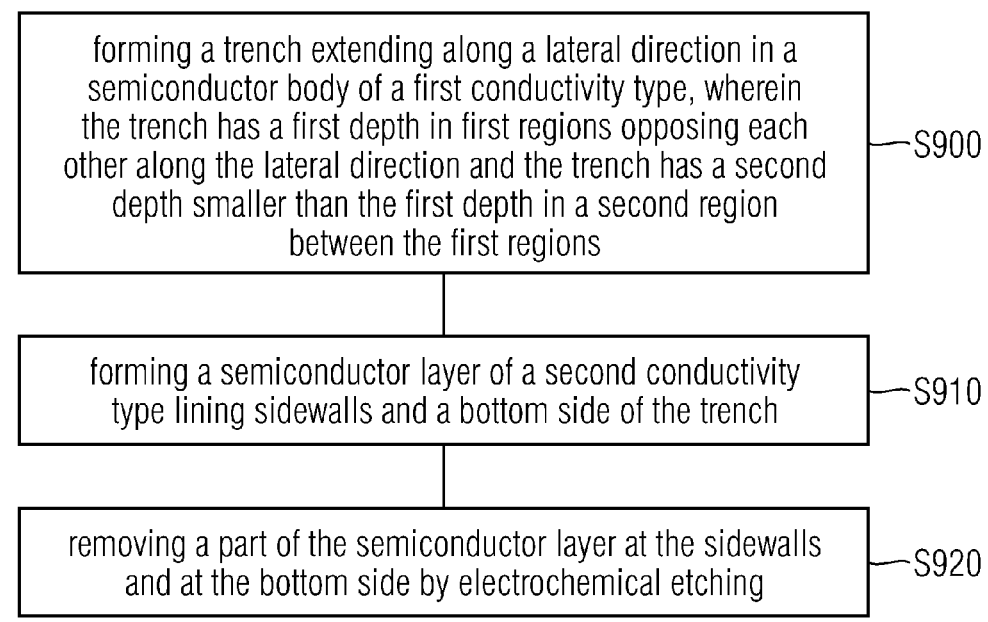
FIG. 9 is a schematic illustration of a process flow of manufacturing a semiconductor device including etching of a part of a semiconductor layer in a trench having a first depth in first regions opposing each other and a second depth smaller than the first depth in a second region between the first regions.

FIG. 9 is a schematic illustration of a process flow of yet another method of manufacturing a super junction semiconductor device.

Process feature S900 includes forming a trench extending along a lateral direction in semiconductor body of a first conductivity type, wherein the trench has a first depth in first regions opposing each other along the lateral direction and the trench has a second depth smaller than the first depth in a second region between the first regions.

Process feature S910 includes forming a semiconductor layer of a second conductivity type lining sidewalls and a bottom side of the trench.

Process feature S920 includes removing a part of the semiconductor layer at the sidewalls and at the bottom side by electrochemical etching.

Apart from process features illustrated in FIGS. 7 to 9, further device elements may be formed together with any one of the illustrated process features, prior to or after any one of these features or between any two of these features. As an example, these methods may also include formation of elements such as a source region, a drain region, a gate structure, a conductive structure electrically coupled to semiconductor elements formed within an active area of the semiconductor body. Thereby, a transistor cell area may be formed in the second region and an edge termination area may be formed in the first regions.

FIGS. 10A to 10G illustrate schematic cross-sectional views of a semiconductor body portion 404 at different process stages during manufacture of a super junction semiconductor device according to an embodiment. As an example, the cross-sectional views may refer to line A-A' of the embodiment illustrated in FIG. 1.

Figure 10A:
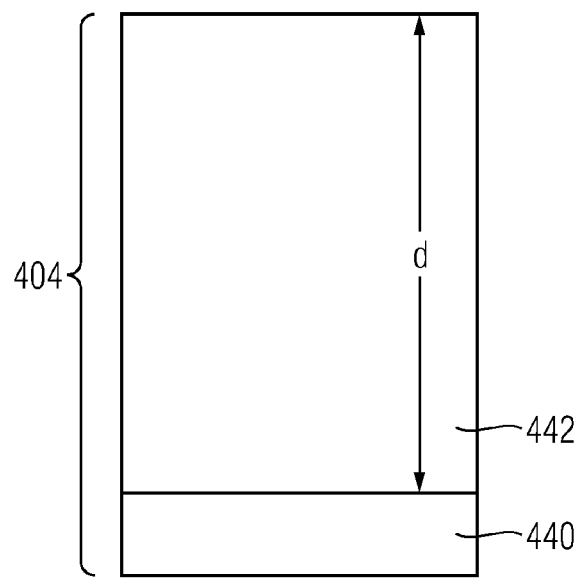
FIG. 10A is a schematic cross-sectional view of a semiconductor body portion for illustrating a method of manufacturing a SJ semiconductor device in accordance with one embodiment.

Referring to FIG. 10A, a semiconductor body 404 including an $n^+$-doped substrate 440 and an n-doped epitaxial layer 442 formed thereon is provided as a base material.

A thickness d of the epitaxial layer 442 may be chosen in accordance with a target thickness of that volume which absorbs a blocking voltage in an operation mode of the finalized device. A dopant concentration within the epitaxial layer 442 may correspond to the target dopant concentration of n-doped columns constituting drift zones of the finalized super junction semiconductor device. The concentration of dopants within the semiconductor layer 442 may be subject to production tolerances. These production tolerances may be due to limited accuracy when setting a dopant concentration during epitaxial growth, for example.

Figure 10B:
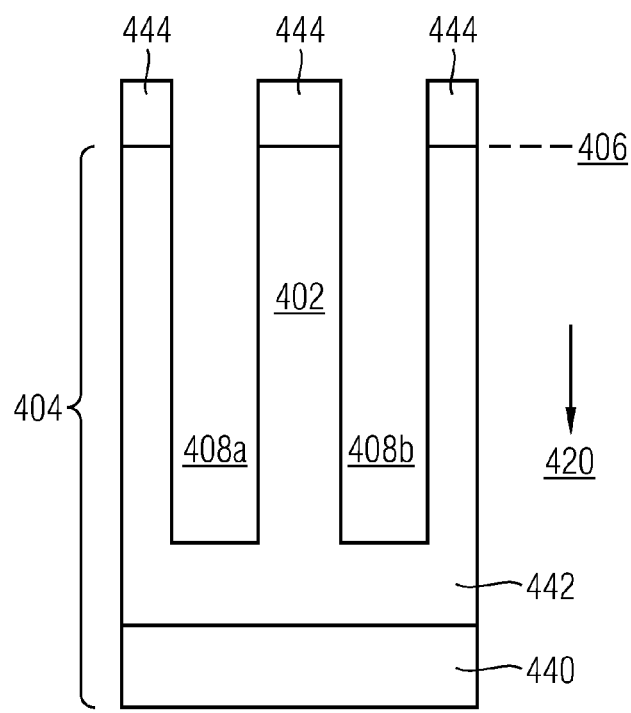
FIG. 10B illustrates one embodiment of a schematic cross-sectional view of the semiconductor body portion of FIG. 10A after formation of first and second trenches.

Referring to the schematic cross-sectional view of FIG. 10B, first and second trenches 408a, 408b are formed within the epitaxial layer 442 extending from a front surface 406 along a vertical direction 420 into a depth of the semiconductor body 404. The trenches 408a, 408b may be etched into the semiconductor body 404 using an etch mask such as a hard mask 444 on the surface 406 of the semiconductor body 404. A bottom side of the trenches 408a, 408b may be arranged within the semiconductor layer 442. A mesa region between the trenches 408a, 408b may define drift zones 402.

Figure 10C:
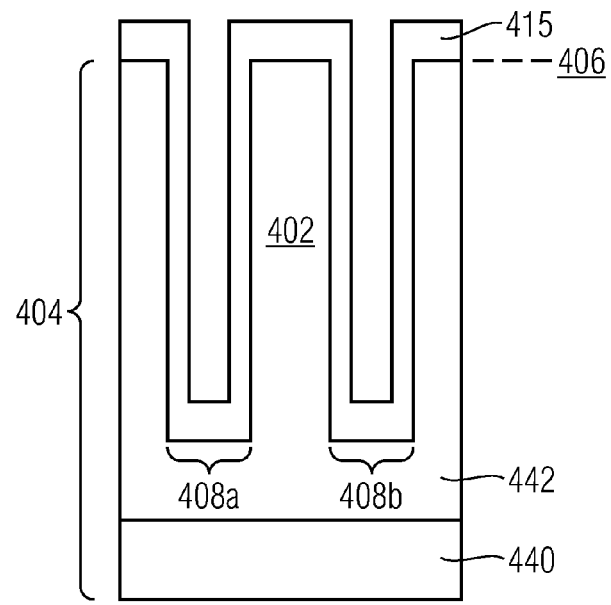
FIG. 10C illustrates one embodiment of a schematic cross-sectional view of the semiconductor body portion of FIG. 10B after formation of an epitaxial semiconductor layer.

Referring to the schematic cross-sectional view of the semiconductor body portion 404 illustrated in FIG. 10C, an epitaxial p-doped layer 415 is formed on the front surface 406 of the semiconductor body 404, at sidewalls and at a bottom side of each of the first and second trenches 408a, 408b.

Figure 10D:
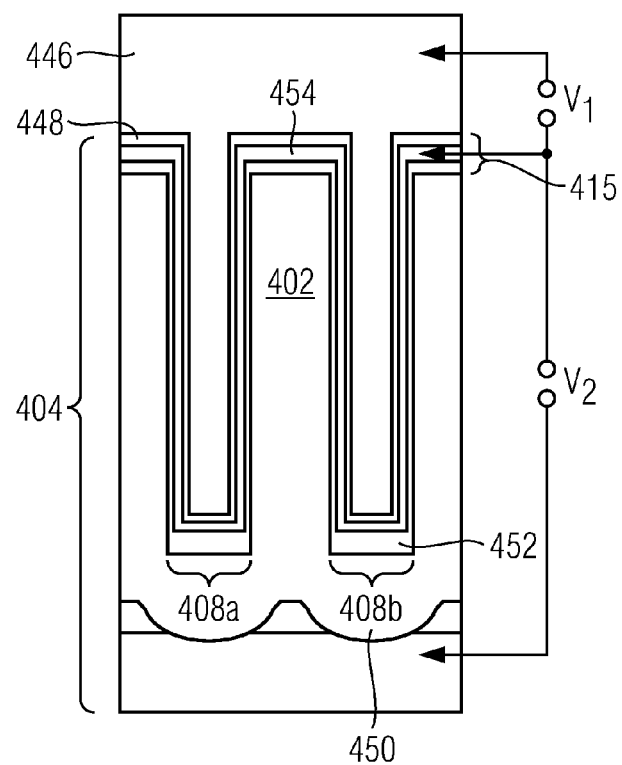
FIG. 10D illustrates one embodiment of a schematic cross-sectional view of the semiconductor body portion of FIG. 10C in a state during electrochemical etching of the epitaxial semiconductor layer.

Referring to the schematic cross-sectional view of the semiconductor body portion 404 illustrated in FIG. 10D, the epitaxial semiconductor layer 415 undergoes electrochemical etching such as alkaline wet etching using an alkaline solution 446. For example, when etching silicon, the alkaline solution may include KOH or TMAH. A voltage $V_1$ is applied between the epitaxial semiconductor layer 415 and the electrochemical alkaline solution 446. A junction between the alkaline solution 446 and the epitaxial semiconductor layer 415 is similar to a Schottky barrier junction. Therefore, a Schottky depletion region 448 builds up at this interface. The voltage $V_1$ may be chosen such that the Schottky diode formed by the junction between the epitaxial semiconductor layer 415 and the alkaline solution 446 is shorted or forward biased.

A voltage $V_2$ is applied between the p-doped epitaxial semiconductor layer 415 and the n-doped semiconductor body 404 such that the pn junction between these regions is reverse biased and a space charge region including a first depletion layer 450 within the semiconductor body 404 and a second depletion layer 452 within the epitaxial semiconductor layer 415 is formed. A value of $V_2$ may be chosen such that a volume of the semiconductor body 404 between the first and second trenches 408a, 408b, i.e., drift zone 402, becomes depleted of free charge carriers. A thickness of the epitaxial semiconductor layer 415 may be chosen such that the depletion regions 448, 452 do not meet after application of the voltages $V_1$, $V_2$. In other words, the voltages $V_1$ and $V_2$ may be chosen such that a neutral volume 454 not constituting a space charge region remains.

Figure 10E:
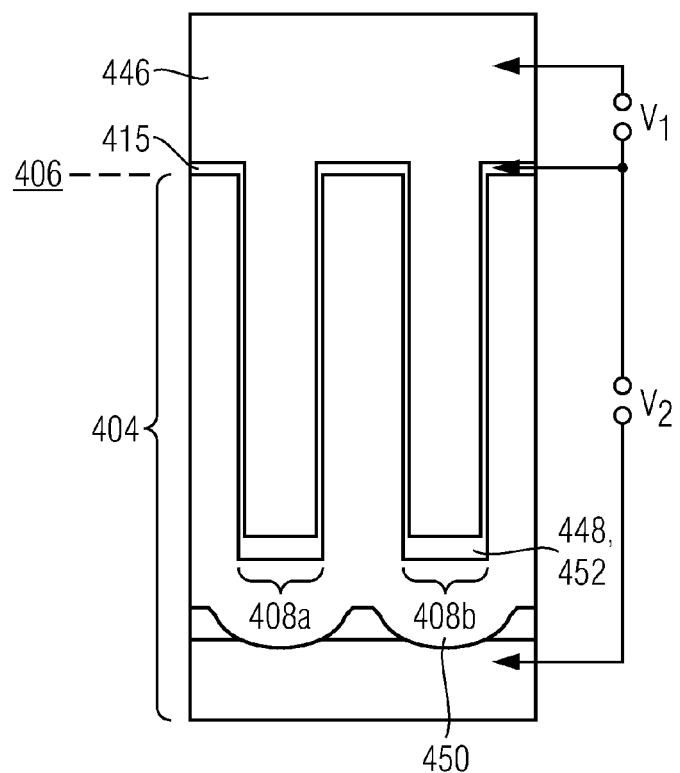
FIG. 10E illustrates one embodiment of a schematic cross-sectional view of the semiconductor body portion of FIG. 10D at the end of electrochemical etching of the epitaxial semiconductor layer.

Referring to the schematic cross-sectional view of the semiconductor body portion 404 illustrated in FIG. 10E, etching of the epitaxial semiconductor layer 415 is terminated once the depletion regions 452 and 448 meet. The volume of the epitaxial semiconductor layer 415 includes two parts, namely the volume of Schottky depletion layer 448 and pn depletion layer 452. Depletion layer 452 causes a precise compensation of the other pn depletion layer 450 formed within the semiconductor body 404. This charge compensation is not affected by any production tolerances during manufacture of device elements. The charges of Schottky depletion layer 448 constitute excess charges with regard to an ideal charge compensation since the Schottky barrier does not remain after removal of the electrochemical alkaline solution. These excess charges may be counterbalanced, maintained for electric field tuning for improving robustness or removed in later process stages. As an example, charges of Schottky depletion layer 448 may be partly or fully removed by isotropic dry or wet etching of a respective portion of epitaxial semiconductor layer 415. As a further example, charges of Schottky depletion layer 448 may also be removed by thermal oxidation of a respective portion of epitaxial semiconductor layer 415 and subsequent removal of the oxide layer by an etch process, for example. As yet another example, charges of Schottky depletion layer 448 may be counterbalanced by filling the trenches 408a, 408b with an epitaxial semiconductor material having a conductivity type different from the conductivity type of the epitaxial semiconductor layer 415. Removal of excess charges by above processes may be carried out after removal of the alkaline solution 446 and before filling the trenches 408a, 408b with a material as described in a later process stage illustrated in FIG. 10G.

Figure 10F:
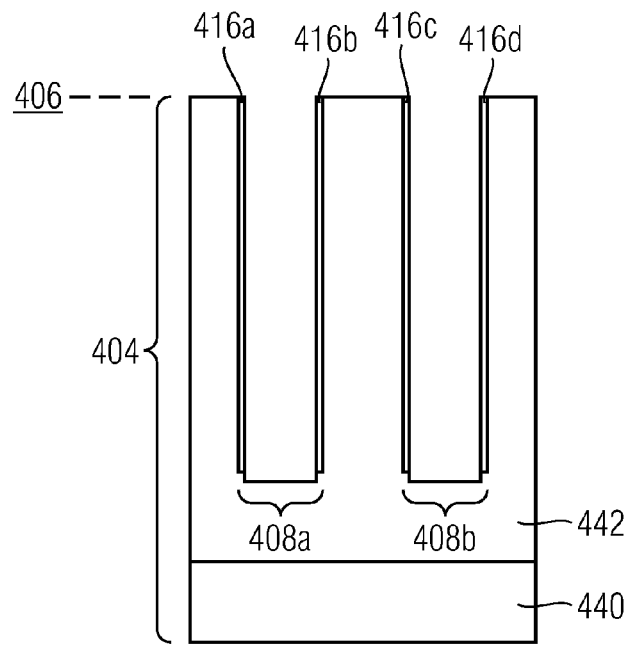
FIG. 10F illustrates one embodiment of a schematic cross-sectional view of the semiconductor body portion of FIG. 10E after electrochemical etching of the semiconductor epitaxial layer and after anisotropic etching of the epitaxial semiconductor layer.

Although the epitaxial semiconductor layer 415 may be maintained at a bottom side within each of the trenches 408a, 408b the schematic cross-sectional view of the semiconductor body portion 404 illustrated in FIG. 10F refers to an embodiment where the epitaxial semiconductor layer 415 is etched to remove those parts of this layer which are located at a bottom side within each of the trenches 408a, 408b and on the front surface 406 of the semiconductor body 404. As an example, anisotropic dry etching may be used to etch the semiconductor layer 415. After etching, the remaining parts of this layer define first semiconductor subzones 416a . . . 416d within the first and second trenches 408a, 408b.

Figure 10G:
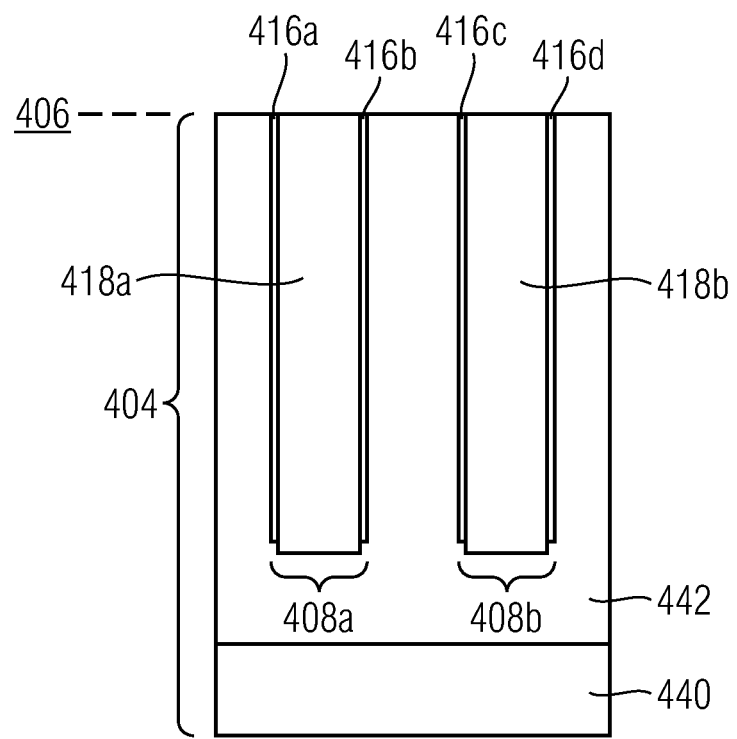
FIG. 10G illustrates one embodiment of a schematic cross-sectional view of the semiconductor body portion of FIG. 10F after filling the first and second trenches with a material.

Referring to the schematic cross-sectional view of the semiconductor body portion 404 illustrated in FIG. 10G, the first and second trenches 408a, 408b are filled with a material as described with reference to FIG. 1.

Further processes may follow or be carried out before, between or together with the processes illustrated in FIGS. 10A to 10G to finalize the SJ semiconductor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device, comprising:
a super junction structure including first and second areas alternately arranged along a first lateral direction and extending in parallel along a second lateral direction; each one of the first areas includes a first semiconductor region of a first conductivity type; each one of the second areas includes, along the first lateral direction, an inner area between opposite second semiconductor regions of a second conductivity type opposite to the first conductivity type; and wherein
a width $w_1$ of the first semiconductor region in a transistor cell area is greater than in an edge termination area, and a width $w_2$ of each one of the second semiconductor regions in the transistor cell area is greater than in the edge termination area.

2. The super junction semiconductor device of claim 1, further comprising a transition area between the transistor cell area and the edge termination area, wherein the widths $w_1$, $w_2$ continuously change, along the second lateral direction, from a first value in the transistor cell area to a second value in the edge termination area, respectively.

3. The super junction semiconductor device of claim 1, further comprising a transition area between the transistor cell area and the edge termination area, wherein the widths $w_1$, $w_2$ in different ones of the alternately arranged first and second areas gradually change, along the first lateral direction, from a first value in the transistor cell area to a second value in the edge termination area, respectively.

4. The super junction semiconductor device of claim 1, wherein the width $w_2$ of each one of the second semiconductor regions in the edge termination area ranges between 30% to 90% of the width $w_2$ in the transistor cell area.

5. The super junction semiconductor device of claim 1, wherein the inner area includes one or a combination of intrinsic semiconductor material, lightly doped semiconductor material, dielectric material and a void.

6. The super junction semiconductor device of claim 1, wherein each one of the first areas is a mesa region and the each one of the second areas includes a trench and the second semiconductor regions lining opposite sidewalls of the trench.

7. The super junction semiconductor device of claim 1, further comprising a transition area between the transistor cell area and the edge termination area, wherein a depth $d_2$ of the second semiconductor regions in different ones of the second areas decreases, along the first lateral direction, from the transistor cell area into the transition area.

8. The super junction semiconductor device of claim 1, further comprising a channel stopper structure including a doped semiconductor region electrically coupled to a field plate, wherein the second semiconductor regions extending along the second lateral direction from the transistor cell area through the edge termination area overlap with the field plate.

* * * * *